United States Patent
Kimura et al.

(10) Patent No.: US 11,923,652 B2
(45) Date of Patent: *Mar. 5, 2024

(54) HEADER FOR SEMICONDUCTOR PACKAGE, AND SEMICONDUCTOR PACKAGE

(71) Applicant: SHINKO ELECTRIC INDUSTRIES CO., LTD., Nagano (JP)

(72) Inventors: Yasuyuki Kimura, Nagano (JP); Takumi Ikeda, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 492 days.

This patent is subject to a terminal disclaimer.

(21) Appl. No.: 17/197,434

(22) Filed: Mar. 10, 2021

(65) Prior Publication Data

US 2021/0305472 A1 Sep. 30, 2021

(30) Foreign Application Priority Data

Mar. 24, 2020 (JP) .................................. 2020-052652

(51) Int. Cl.
*H01S 5/02315* (2021.01)
*H01S 5/024* (2006.01)

(52) U.S. Cl.
CPC ...... *H01S 5/02315* (2021.01); *H01S 5/02415* (2013.01)

(58) Field of Classification Search
CPC .......................... H01S 5/02315; H01S 5/02415
USPC ......................................................... 361/767
See application file for complete search history.

(56) References Cited

U.S. PATENT DOCUMENTS

| 8,233,512 B2 | 7/2012 | Tamaya et al. |
| 2004/0126066 A1 | 7/2004 | Keh et al. |
| 2005/0047460 A1 | 3/2005 | Go et al. |
| 2005/0089070 A1* | 4/2005 | Honda ................ H01S 5/02212 372/36 |

(Continued)

FOREIGN PATENT DOCUMENTS

| CN | 108390255 | 8/2018 |
| JP | 2006-041234 | 2/2006 |

(Continued)

OTHER PUBLICATIONS

Office Action dated Jul. 11, 2023 with respect to the corresponding Japanese patent application No. 2020-052652.

(Continued)

*Primary Examiner* — Andargie M Aychillhum
(74) *Attorney, Agent, or Firm* — IPUSA, PLLC

(57) ABSTRACT

A header for a semiconductor package, includes an eyelet having an upper surface, and a lower surface on an opposite side from the upper surface, a metal block having a side surface, and configured to protrude from the upper surface of the eyelet, a lead sealed in a through hole which penetrates the eyelet from the upper surface to the lower surface of the eyelet, and a substrate having a front surface formed with a signal pattern electrically connected to the lead, and a back surface on an opposite side from the front surface. The back surface of the substrate is fixed to the side surface of the metal block. A portion of the back surface of the substrate is exposed from the metal block, and this portion of the substrate is formed with a ground pattern.

12 Claims, 17 Drawing Sheets

(56) References Cited

U.S. PATENT DOCUMENTS

| | | |
|---|---|---|
| 2005/0100064 A1 | 5/2005 | Stewart et al. |
| 2005/0105572 A1 | 5/2005 | Simoun-Ou et al. |
| 2005/0111503 A1 | 5/2005 | Ishigami et al. |
| 2006/0176918 A1* | 8/2006 | Aruga ............... H01S 5/02345 372/38.1 |
| 2007/0228535 A1 | 10/2007 | Fujino et al. |
| 2008/0013576 A1 | 1/2008 | Honda |
| 2008/0137699 A1 | 6/2008 | Aruga |
| 2016/0352069 A1 | 12/2016 | Kimura et al. |
| 2017/0093123 A1 | 3/2017 | Takizawa et al. |
| 2017/0133821 A1 | 5/2017 | Kimura |
| 2018/0194134 A1* | 7/2018 | Kawakubo ............. B41J 2/1607 |
| 2020/0067265 A1 | 2/2020 | Hettler et al. |
| 2020/0287347 A1 | 9/2020 | Wang |
| 2021/0271038 A1 | 9/2021 | Noguchi et al. |
| 2021/0305472 A1 | 9/2021 | Kimura et al. |
| 2022/0069544 A1 | 3/2022 | Wai Li et al. |
| 2022/0238980 A1 | 7/2022 | Drogemuller et al. |

FOREIGN PATENT DOCUMENTS

| | | |
|---|---|---|
| JP | 2006-216839 | 8/2006 |
| JP | 2011-108939 | 6/2011 |
| JP | 2016-189431 | 11/2016 |
| JP | 2016189431 A * | 11/2016 |
| JP | 2021-077858 | 5/2021 |
| JP | 2022-116383 | 8/2022 |
| WO | 2003/081735 | 10/2003 |

OTHER PUBLICATIONS

Office Action dated May 10, 2023 issued with respect to the related U.S. Appl. No. 17/206,275.

Office Action dated Jul. 11, 2023 with respect to the corresponding Japanese patent application No. 2020-052653.

Office Action dated Oct. 27, 2023 issued with respect to the related U.S. Appl. No. 17/206,275.

* cited by examiner

HEADER FOR SEMICONDUCTOR PACKAGE, AND SEMICONDUCTOR PACKAGE

CROSS-REFERENCE TO RELATED APPLICATIONS

This application is based upon and claims priority to Japanese Patent Application No. 2020-052652, filed on Mar. 24, 2020, the entire contents of which are incorporated herein by reference.

FIELD

Certain aspects of the embodiments discussed herein are related to headers for semiconductor packages, and semiconductor packages.

BACKGROUND

There are various types of light emitting devices. For example, an Electro-absorption Modulator integrated with distributed feed-back (DFB) Laser (EML), a Directly Modulated Laser (DML), or the like are examples of known light emitting devices. These light emitting devices may be used for optical communication, for example.

In order to stabilize the oscillation wavelength of the light emitting devices described above, a Peltier device, which is a temperature regulator, may be provided inside the semiconductor package. In this case, the length of a transmission line inside the semiconductor package becomes long due to the provision of the Peltier device, thereby requiring a relay substrate which takes the transmission loss into consideration, and a metal block for holding the relay substrate. The relay substrate and the metal block may be arranged on an eyelet.

Because the Peltier device is a semiconductor heat transport device, no electrical continuity is required in up-and-down directions. For this reason, in a case where a device mounting substrate mounted with the light emitting device is arranged on the Peltier device, for example, the device mounting substrate assumes an electrically floating state with respect to the eyelet, thereby making it undesirable for processing high-frequency signals.

For this reason, there are studies to improve the electric characteristics by connecting the metal block which holds the back surface of the relay substrate and the metal block which holds the back surface of the device mounting substrate by a metal wire, in addition to connecting the ground on the front side of the relay substrate and the ground on the front side of the device mounting substrate by a metal wire.

However, when adding the metal wires between the metal blocks, considerations need to be made so that the heat of the light emitting device transferred by the Peltier device will not be fed back to the light emitting device by passing through the relay substrate or the like again. In other words, increasing the number of metal wires to be added will improve the electric characteristics, but at the same time, will more easily feed back the heat to the light emitting device through the metal wires. Consequently, it is undesirable to increase the number of metal wires without reason. For this reason, it is desirable to further improve the electric characteristics using a relatively small number of metal wires.

An example of a Transistor Outlined CAN (TO-CAN) Transmitter Optical Sub-Assembly (TOSA) module is described in Japanese Laid-Open Patent Publication No. 2011-108939, for example.

SUMMARY

Accordingly, it is an object in one aspect of the embodiments to provide a header for a semiconductor package, and the semiconductor package, which can further improve the electric characteristics.

According to one aspect of the embodiments, a header for a semiconductor package, includes an eyelet having an upper surface, and a lower surface on an opposite side from the upper surface; a first metal block having a first side surface, and configured to protrude from the upper surface of the eyelet; a first lead sealed in a first through hole which penetrates the eyelet from the upper surface to the lower surface of the eyelet; and a first substrate having a front surface formed with a first signal pattern electrically connected to the first lead, and a back surface on an opposite side from the front surface thereof, wherein the back surface of the first substrate is fixed to the first side surface of the first metal block, a first portion of the back surface of the first substrate is exposed from the first metal block, and the first portion of the first substrate is formed with a ground pattern.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
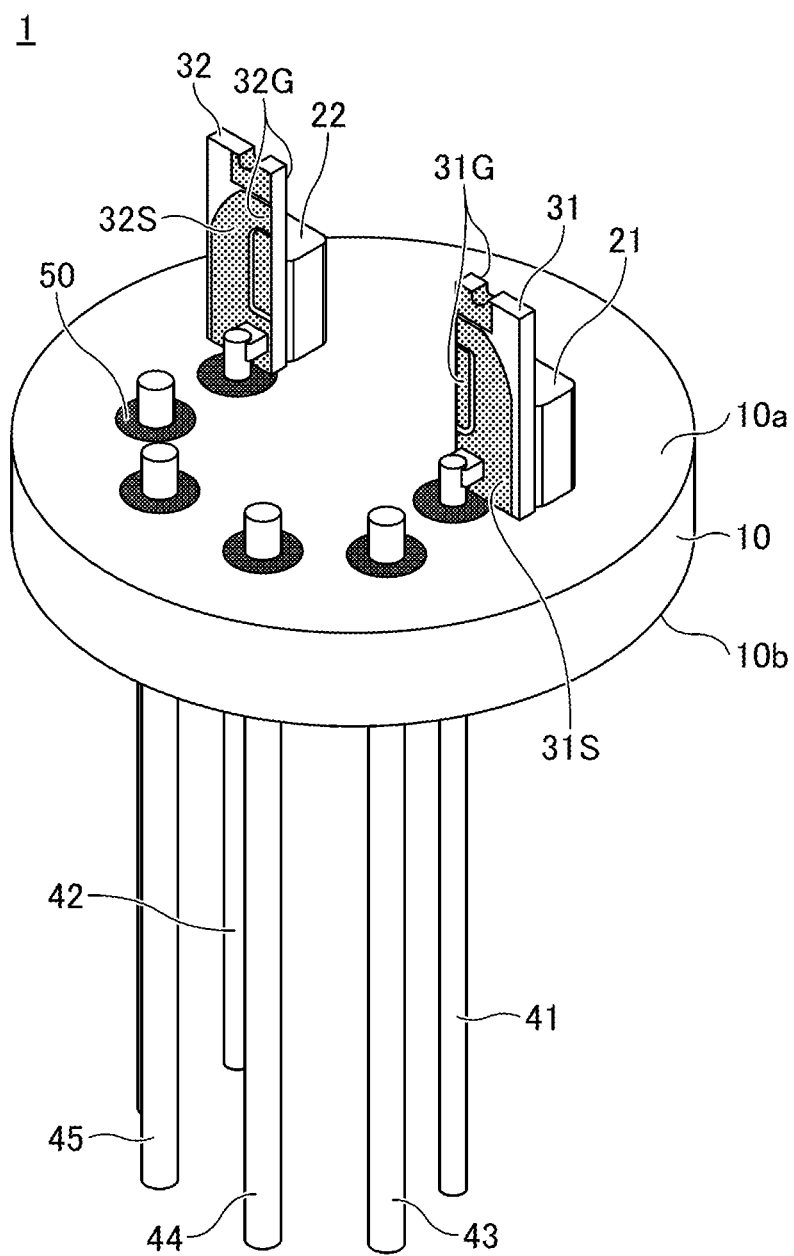
FIG. 1 is a perspective view (part 1) illustrating an example of a header for a semiconductor package according to a first embodiment.

Preferred embodiments of the present invention will be described with reference to the accompanying drawings. In the drawings, those parts that are the same are designated by the same reference numerals, and a repeated description of the same parts may be omitted.

A description will now be given of a header for a semiconductor package, and the semiconductor package, according to each embodiment of the present invention.

<First Embodiment>

Figure 2:
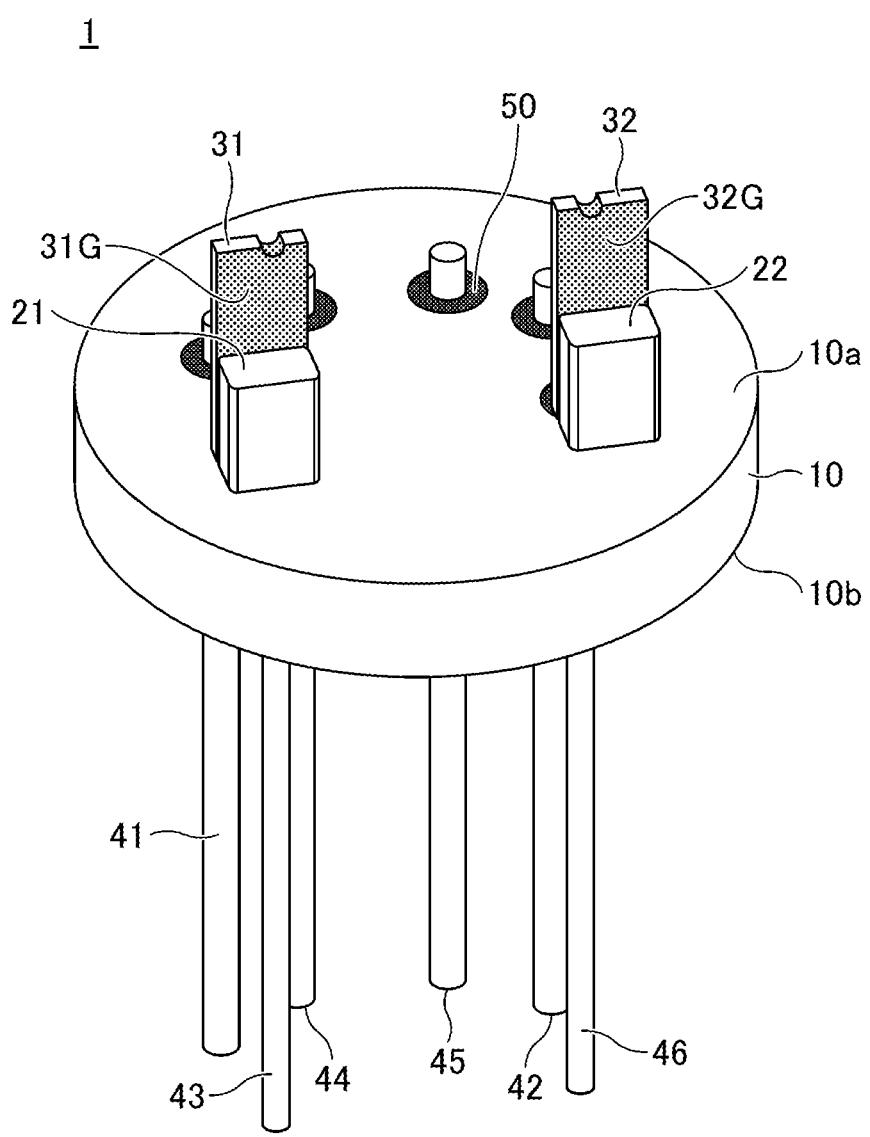
FIG. 2 is a perspective view (part 2) illustrating the example of the header for the semiconductor package according to the first embodiment.
Figure 3:
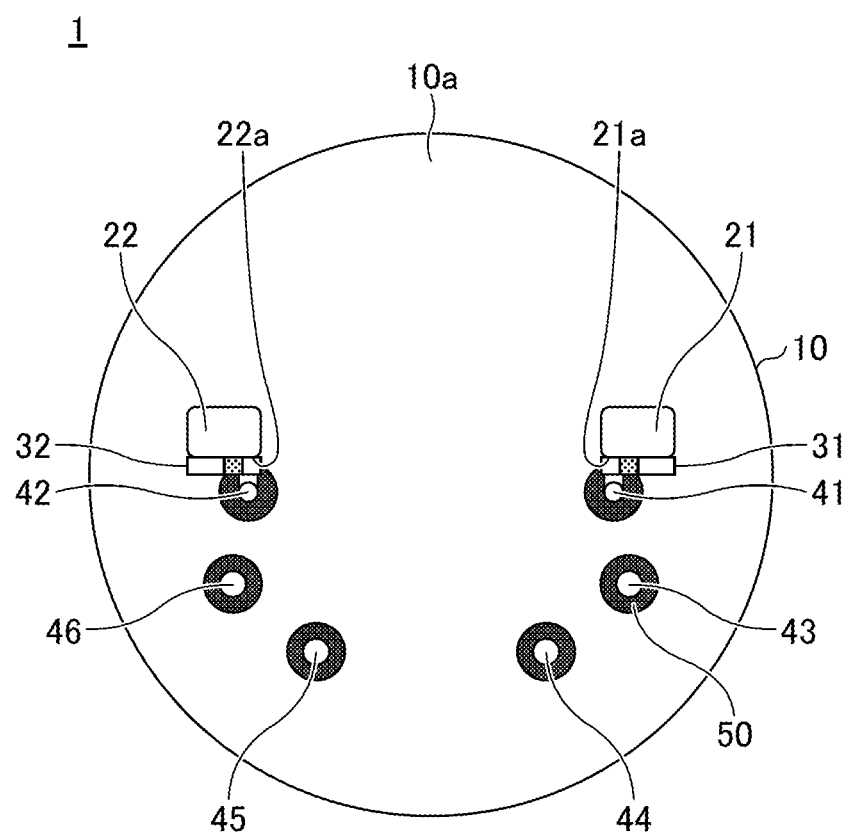
FIG. 3 is a plan view illustrating the example of the header for the semiconductor package according to the first embodiment.

FIG. 1 is a perspective view (part 1) illustrating an example of the header for the semiconductor package according to a first embodiment, and illustrates the header for the semiconductor package viewed from the front sides of a first substrate and a second substrate. FIG. 2 is a perspective view (part 2) illustrating the example of the header for the semiconductor package according to the first embodiment, and illustrates the header for the semiconductor package viewed from the back surfaces of the first substrate and the second substrate. FIG. 3 is a plan view illustrating the example of the header for the semiconductor package according to the first embodiment.

As illustrated in FIG. 1 through FIG. 3, a header 1 for a semiconductor package according to the first embodiment includes an eyelet 10, a first metal block 21, a second metal block 22, a first substrate 31, a second substrate 32, a first lead 41, a second lead 42, a third lead 43, a fourth lead 44, a fifth lead 45, a sixth lead 46, and a sealer 50. The header 1 for the semiconductor package may be used as a header for a Directly Modulated Laser (DML), for example.

The eyelet 10 is a disk-shaped member. A diameter of the eyelet 10 is not particularly limited. The diameter of the eyelet 10 may be appropriately determined according to the purpose, and may be 3.8 mm, 5.6 mm, or the like, for example. A thickness of the eyelet 10 is not particularly limited, and may be appropriately determined according to the purpose. The thickness of the eyelet 10 may be approximately 1.0 mm to approximately 1.5 mm, for example. The eyelet 10 may be formed of a metal material such as iron or the like, for example. The eyelet 10 may be formed of a metal material (for example, the so-called cladding material) in which a plurality of metal layers (for example, copper layers, iron layers, or the like) are laminated. A gold plating or the like may be applied to a surface of the eyelet 10.

In this specification, the term "disk-shaped" refers to a planar shape that is approximately circular with a predetermined thickness. The thickness with respect to the diameter of a "disk-shaped" object is not particularly limited, and may be small or large. In addition, the "disk-shaped" object may be partially formed with concave portions, convex portions, through holes, or the like. In this specification, a plan view of the object refers to a view of the object viewed from a normal direction to an upper surface 10a of the eyelet 10, and the planar shape of the object refers to a shape of the object in the plan view viewed from the normal direction to the upper surface 10a of the eyelet 10.

One or more cutouts may be formed at an outer edge portion of the eyelet 10. In the plan view, the cutout may have a shape that caves in from the outer periphery towards the center of the eyelet 10. The cutout may be a cavity having a planar shape that is approximately triangular or approximately rectangular, for example. The one or more cutouts may be used for position alignment or the like of a device mounting surface when mounting the semiconductor device on the header 1 for the semiconductor package, for example. Further, the one or more cutouts may be used for position alignment or the like of the header 1 for the semiconductor package in a rotating direction, for example.

The first metal block 21 and the second metal block 22 are columnar members protruding from the upper surface 10a of the eyelet 10, and are arranged on the upper surface 10a of the eyelet 10 at positions separated from each other. A side surface of the first metal block 21 facing the first lead 41 forms a substrate fixing surface 21a for fixing the first substrate 31.

Similarly, a side surface of the second metal block 22 facing the second lead 42 forms a substrate fixing surface 22a for fixing the second substrate 32. The substrate fixing surfaces 21a and 22a are arranged to be approximately perpendicular with respect to the upper surface 10a of the eyelet 10, for example. The substrate fixing surface 21a and the substrate fixing surface 22a face the same direction, and are positioned on the same plane, for example.

The first metal block 21 and the second metal block 22 may be formed of a metal material, such as iron or the like, for example. The first metal block 21 and the second metal block 22 are bonded to the eyelet 10 by a conductive material, such as a brazing filler material or the like, for example. The first metal block 21 and the second metal block 22 may be formed integrally with the eyelet 10, by a cold forged press or the like, for example. The first metal block 21 and the second metal block 22 have a rectangular parallelepiped shape, for example, but the first metal block 21 and the second metal block 22 may have an arbitrary shape as long as a portion of the back surface thereof can be exposed.

The first substrate 31 is fixed to the substrate fixing surface 21a. A signal pattern 31S and a ground pattern 31G are provided on a front surface (a surface facing the first lead 41) of the first substrate 31. A ground pattern 31G is provided on a back surface (a surface facing the first metal block 21) of the first substrate 31, as a solid layer. The ground pattern 31G on the front surface of the first substrate 31 and the ground pattern 31G on the back surface of the first substrate 31 are electrically connected via a through hole penetrating the first substrate 31.

The back surface of the first substrate 31 is fixed to the substrate fixing surface 21a by the conductive material, such as the brazing filler material (for example, a gold-tin alloy) or the like. Accordingly, the ground pattern 31G on the back surface of the first substrate 31 is electrically connected to the first metal block 21, and the first metal block 21 has a ground potential (reference potential) GND.

With reference to the upper surface 10a of the eyelet 10, a height of the first metal block 21 is lower than a height of the first substrate 31. For this reason, at least a portion of the ground pattern 31G on the back surface of the first substrate 31 is exposed from the first metal block 21, and a wire bonding or the like can be performed on the exposed portion from the back surface of the first substrate 31.

When the ease of mounting the first substrate 31 is taken into consideration, the height of the first metal block 21 with reference to the upper surface 10a of the eyelet 10 is preferably ½ the height of the first substrate 31 or greater. For example, when the height of the first substrate 31 with reference to the upper surface 10a of the eyelet 10 is 2 mm, the height of the first metal block 21 is preferably 1 mm or greater.

The second substrate 32 is fixed to the substrate fixing surface 22a. A signal pattern 32S and a ground pattern 32G are provided on a front surface (a surface facing the second lead 42) of the second substrate 32. A ground pattern 32G is provided on a back surface (a surface facing the second metal block 22) of the second substrate 32, as a solid layer. The ground pattern 32G on the front surface of the second substrate 32 and the ground pattern 32G on the back surface of the second substrate 32 are electrically connected via a through hole penetrating the second substrate 32.

The back surface of the second substrate 32 is fixed to the substrate fixing surface 22a by the conductive material, such as the brazing filler material (for example, a gold-tin alloy) or the like. Accordingly, the ground pattern 32G on the back surface of the second substrate 32 is electrically connected to the second metal block 22, and the second metal block 22 has the ground potential (reference potential) GND.

With reference to the upper surface 10a of the eyelet 10, a height of the second metal block 22 is lower than a height of the second substrate 32. For this reason, at least a portion of the ground pattern 32G on the back surface of the second substrate 32 is exposed from the second metal block 22, and a wire bonding or the like can be performed on the exposed portion from the back surface of the second substrate 32.

When the ease of mounting the second substrate 32 is taken into consideration, the height of the second metal block 22 with reference to the upper surface 10a of the eyelet 10 is preferably ½ the height of the second substrate 31 or greater. For example, when the height of the second substrate 32 with reference to the upper surface 10a of the eyelet 10 is 2 mm, the height of the second metal block 22 is preferably 1 mm or greater.

The first substrate 31 and the second substrate 32 may be formed of alumina or aluminum nitride, for example. Alumina, which has a low thermal conductivity, is particularly preferable for forming the first substrate 31 and the second substrate 32. The signal patterns 31S and 32S and the ground patterns 31G and 32G may be formed of tungsten, titanium, gold, or the like, for example. A gold plating or the like may be formed on surfaces of the signal patterns 31S and 32S and the ground patterns 31G and 32G.

The first lead 41, the second lead 42, the third lead 43, the fourth lead 44, the fifth lead 45, and the sixth lead 46 are provided inside the through holes penetrating the eyelet 10 from the upper surface 10a to a lower surface 10b, and are sealed in a longitudinal direction thereof towards a thickness direction of the eyelet 10. In other words, peripheries of the first lead 41, the second lead 42, the third lead 43, the fourth lead 44, the fifth lead 45, and the sixth lead 46 are sealed inside the respective through holes by the sealer 50.

A portion of each of the first lead 41 and the second lead 42 protrudes upward from the upper surface 10a of the eyelet 10 by a protruding amount of approximately 0 to approximately 0.3 mm, for example. S portion of each of the third lead 43, the fourth lead 44, the fifth lead 45, and the sixth lead 46 projects upward from the upper surface 10a of the eyelet 10 by a protruding amount of approximately 0 to approximately 2 mm, for example.

In addition, a portion of each of the first lead 41, the second lead 42, the third lead 43, the fourth lead 44, the fifth lead 45, and the sixth lead 46 protrudes downward from the lower surface 10b of the eyelet 10 by a protruding amount of approximately 6 mm to approximately 10 mm, for example.

The first lead 41, the second lead 42, the third lead 43, the fourth lead 44, the fifth lead 45, and the sixth lead 46 are formed of a metal, such as iron-nickel alloys, Kovar (registered trademark), or the like, for example. The sealer 50 is formed of an insulating material, such as glass materials or the like, for example. A gold plating or the like may be formed on surfaces of the first lead 41, second lead 42, third lead 43, fourth lead 44, fifth lead 45, and sixth lead 46.

The portion of the first lead 41 protruding from the upper surface 10a of the eyelet 10 is electrically connected to the signal pattern 31S of the first substrate 31 by the brazing filler material (for example, the gold-tin alloy) or the like. In addition, the portion of the second lead 42 protruding from the upper surface 10a of the eyelet 10 is electrically connected to the signal pattern 32S of the second substrate 32 by the brazing filler material (for example, the gold-tin alloy) or the like.

The first lead 41 and the second lead 42 form a differential signal path that is electrically connected to a light emitting device mounted on the header 1 for the semiconductor package via the signal patterns 31S and 32S. The third lead 43, fourth lead 44, fifth lead 45, and sixth lead 46 form signal paths electrically connected to the ground GND, a Peltier device mounted on the header 1 for semiconductor package, and a temperature sensor mounted on the header 1 for semiconductor package. The number of leads is not particularly limited, and the number of leads may be increased or decreased, as appropriate.

Figure 4:
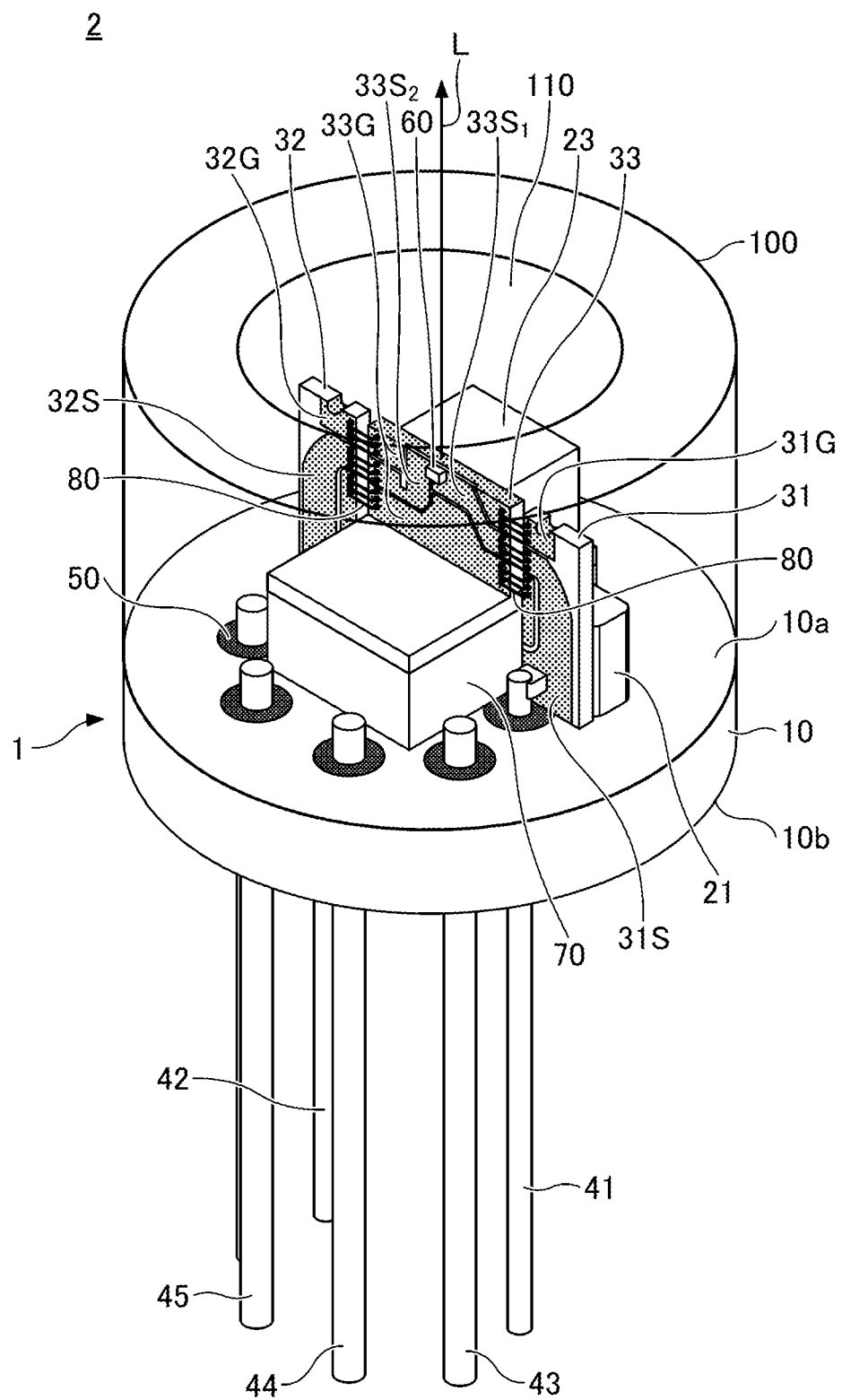
FIG. 4 is a perspective view (part 1) illustrating an example of the semiconductor package according to the first embodiment.
Figure 5:
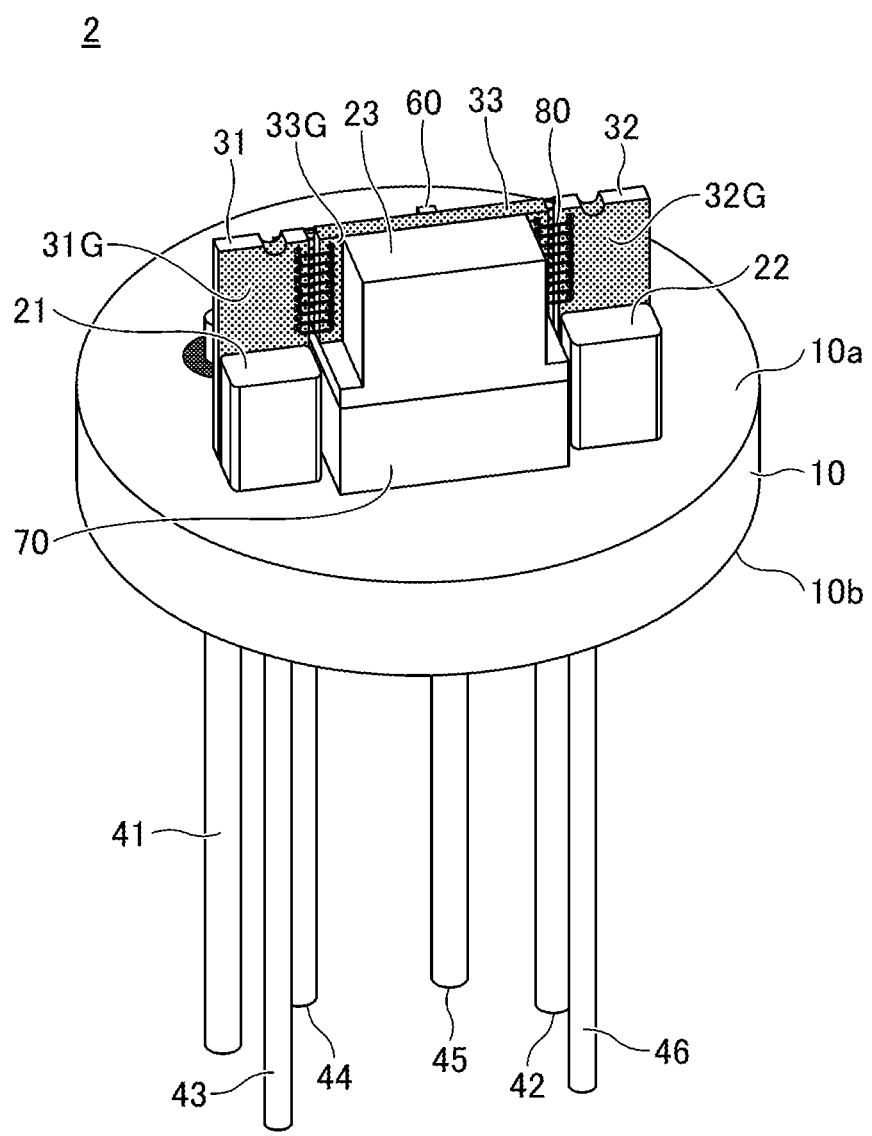
FIG. 5 is a perspective view (part 2) illustrating the example of the semiconductor package according to the first embodiment.
Figure 6:
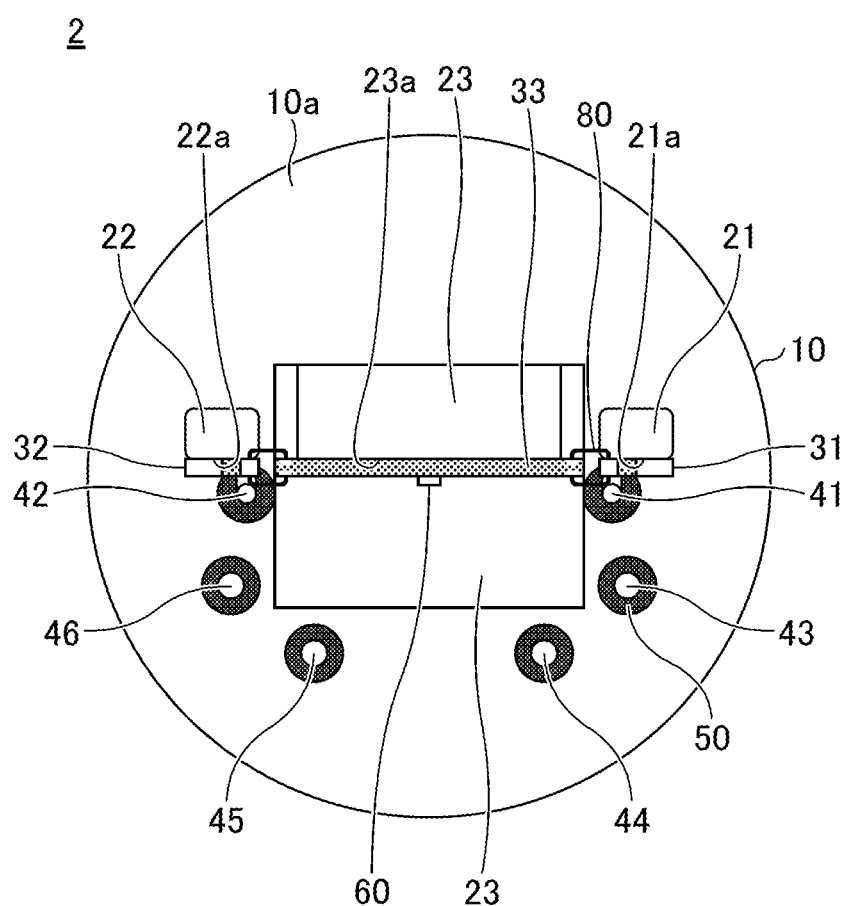
FIG. 6 is a plan view illustrating the example of the semiconductor package according to the first embodiment.

FIG. 4 is a perspective view (part 1) illustrating an example of the semiconductor package according to the first embodiment, and illustrates the semiconductor package viewed from the front surface side of the first substrate and the second substrate. FIG. 5 is a perspective view (part 2) illustrating the example of the semiconductor package according to the first embodiment, and illustrates the semiconductor package viewed from the back surface side of the first substrate and the second substrate. FIG. 6 is a plan view illustrating the example of the semiconductor package according to the first embodiment. In FIG. 4, a cap 100 is illustrated as being transparent for the sake of convenience. On the other hand, the illustration of the cap 100 and a transparent member 110 is omitted in FIG. 5 and FIG. 6.

As illustrated in FIG. 4 through FIG. 6, a semiconductor package 2 according to the first embodiment includes the header 1 for the semiconductor package (refer to FIG. 1 through FIG. 3), a third metal block 23, a third substrate 33, a light emitting device 60, a Peltier device 70, the cap 100, and the transparent member 110.

As illustrated in FIG. 4, in the semiconductor package 2, the cap 100, integral with the transparent member 110, is fixed to the semiconductor package 1 by a resistance welding or the like. The transparent member 110 is a lens, a window, or the like for extracting light L emitted from the light emitting device 60. The cap 100 is formed of a metal, such as stainless steel or the like, for example, and hermetically seals therein major components, such as the light emitting device 60 of the header 1 for the semiconductor package.

The third metal block 23 is an approximately L-shaped member, and is fixed on the Peltier device 70 arranged on the upper surface 10a of the eyelet 10. The third metal block 23 is arranged between the first metal block 21 and the second metal block 22 at a position so as not to make contact with the first metal block 21 and the second metal block 22. In other words, the third metal block 23 is arranged at the position separated from the first metal block 21 and the second metal block 22.

A surface of the third metal block 23 facing the fourth lead 44 and the fifth lead 45 is a substrate fixing surface 23a for fixing the third substrate 33. The substrate fixing surface 23a is arranged to be approximately perpendicular with respect to the upper surface 10a of the eyelet 10, for example. The substrate fixing surface 23a faces the same direction as the substrate fixing surfaces 21a and 22a, and for example, the substrate fixing surface 23a and the substrate fixing surfaces 21a and 22a are coplanar.

The third metal block 23 may be formed of a metal material, such as copper tungsten or the like, for example, by taking into consideration the heat dissipation and the coefficient of thermal expansion. The third metal block 23 is fixed on the Peltier device 70 by an adhesive agent or the like having a high thermally conductivity, for example. The third metal block 23 is approximately L-shaped, for example, but may have an arbitrary shape as long as a portion of the back surface of the third substrate 33 can be exposed.

The third substrate 33 is fixed to the substrate fixing surface 23a. The front surface (the surface facing the fourth lead 44 and the fifth lead 45) of the third substrate 33 is provided with signal patterns $33S_1$ and $33S_2$ and a ground pattern 33G. The back surface (the surface facing the third metal block 23) of the third substrate 33 is provided with a ground pattern 33G as a solid layer. The ground pattern 33G on the front surface of the third substrate 33 and the ground pattern 33G on the back surface are electrically connected via a side surface of the third substrate 33.

The third substrate 33 is formed of aluminum nitride in view, by taking the thermal conductivity into consideration. The signal patterns $33S_1$ and $33S_2$ and the ground pattern 33G may be formed of tungsten, titanium, gold, or the like, for example. A gold plating or the like may be formed on surfaces of the signal patterns $33S_1$ and $33S_2$ and the ground pattern 33G.

At the front surface of the third substrate 33, the signal pattern $33S_1$ is electrically connected to the signal pattern 31S via one or more wiring members 80. The wiring members 80 are conductive members such as wires, for example. In addition, at the front surface of the third substrate 33, the signal pattern $33S_2$ is electrically connected to the signal pattern 32S via one or more wiring members 80. Further, at the front surface of the third substrate 33, the ground pattern 33G is electrically connected to the ground patterns 31G and 32G via one or more wiring members 80. The number of wiring members 80 for making the electrical connections described above is not particularly limited, and may be an arbitrary number which is one or more. The wiring member 80 may be a bonding wire, for example, but is not particularly limited as long as the wiring member has a shape in the form of a wiring or line. Another example of the wiring member 80 includes a ribbon. Further, a metal wire or the like may be used for the wiring member 80 and bonded using a solder.

The signal patterns $33S_1$ and $33S_2$ are electrically connected to terminals of the light emitting device 60 mounted on the front surface of the third substrate 33. In order to cope with a differential type driving circuit which drives the light emitting device 60, two systems of driving signal input lines, namely the signal patterns $33S_1$ and $33S_2$, are required. A positive phase signal is input to one of the signal patterns $33S_1$ and $33S_2$, and a negative phase signal, obtained by inverting the positive phase signal, is input to the other of the signal patterns $33S_1$ and $33S_2$. The light emitting device 60 may be a semiconductor laser chip which emits light having a wavelength of 1310 nm or the like, for example.

The back surface of the third substrate 33 is fixed to the substrate fixing surface 23a by the conductive material such as the brazing filler material (for example, the gold-tin alloy) or the like. Accordingly, the ground pattern 33G on the back surface of the third substrate 33 is electrically connected to the third metal block 23, and the third metal block 23 has the ground potential (reference potential) GND.

A width of the substrate fixing surface 23a of the third metal block 23 is narrower than a width of the third substrate 33, and the third substrate 33 is fixed to the substrate fixing surface 23a so that both sides of the back surface of the third substrate 33 (on the sides of the first substrate 31 and the second substrate 32) protrude from both sides of the third metal block 23. For this reason, at least a portion of the ground pattern 33G on the back surface of the third substrate 33 is exposed from the third metal block 23 on the sides of the first substrate 31 and the second substrate 32.

The ground pattern 33G foisted on the back surface of the third substrate 33 exposed from the third metal block 23 on the sides of the first substrate 31, and the ground pattern 31G formed on the back surface of the first substrate 31 exposed from the first metal block 21, are electrically connected to each other via the one or more wiring members 80. The number of wiring members 80 electrically connecting the ground pattern 33G and the ground pattern 31G on the back surfaces of the third substrate 33 and the first substrate 31, respectively, is not particularly limited, and may be an arbitrary number which is one or more. However, from a viewpoint of the stability of the potential of the ground GND, the number of wiring members 80 is preferably two or more.

On the other hand, the number of wiring members 80 electrically connecting the ground pattern 33G and the ground pattern 31G at the back surfaces of the third substrate 33 and the first substrate 31 is preferably ten or less, in order to prevent the heat, generated from the light emitting device 60 during operation thereof and transferred by the Peltier device 70, from being fed back to the light emitting device 60 via the first substrate 31 and the third substrate 33.

The ground pattern 33G formed on the back surface of the third substrate 33 and exposed from the third metal block 23 on the side of the second substrate 32, and the ground pattern 32G formed on the back surface of the second substrate 32 and exposed from the second metal block 22, are electrically connected to each other via one or more wiring members 80. The number of the wiring members 80 electrically connecting the ground pattern 33G and the ground pattern 32G on the back surfaces of the third substrate 33 and the second substrate 32 is not particularly limited, and may be an arbitrary number which is one or more. However, from a viewpoint of the stability of the potential of the ground GND, the number of wiring members 80 is preferably two or more.

On the other hand, the number of wiring members 80 electrically connecting the ground pattern 33G and the ground pattern 32G at the back surfaces of the third substrate 33 and the second substrate 32 is preferably ten or less, in order to prevent the heat, generated from the light emitting device 60 during operation thereof and transferred by the Peltier device 70, from being fed back to the light emitting device 60 via the second substrate 32 and the third substrate 33.

As described above, in the semiconductor package 2, at least a portion of the ground pattern 31G on the back surface of the first substrate 31 is exposed from the first metal block 21, and at least a portion of the ground pattern 32G on the back surface of the second substrate 32 is exposed from the second metal block 22. Moreover, at least a portion of the ground pattern 33G on the back surface of the third substrate 33 is exposed from the third metal block 23 on the sides of the first substrate 31 and the second substrate 32.

The ground pattern 31G on the back of the first substrate 31 and exposed from the first metal block 21, and the ground pattern 33G on the back surface of the third substrate 33 and exposed from the third metal block 23 on the side of the first substrate 31, are electrically connected to each other via one or more wiring members 80. In addition, the ground pattern 32G on the back surface of the second substrate 32 and exposed from the second metal block 22, and the ground pattern 33G on the back surface of the third substrate 33 and exposed from the third metal block 23 on the side of the second substrate 32, are electrically connected to each other via one or more wiring members 80.

In other words, instead of electrically connecting the back surfaces of the metal blocks by the wiring members, this embodiment electrically connects the ground pattern 31G on the back surface of the first substrate 31, the ground pattern 32G on the back surface of the second substrate 32, and the ground pattern 33G on the back surface of the third substrate 33 to each other by the one or more wiring members 80. For this reason, because the ground patterns of the different substrates can be electrically connected to each other with the shortest distance without interposing a metal block, this embodiment can further improve the electric characteristics.

In addition, the effect of improving the electric characteristic can be obtained, even if the electrical connection between the ground pattern 31G on the back surface of the first substrate 31 and the ground pattern 33G on the back surface of the third substrate 33 is made using a single bonding wire having a diameter of 25 μm, for example. Similarly, the effect of improving the electric characteristic can be obtained (refer to simulation results which will be described later), even if the electrical connection between the ground pattern 32G on the back surface of the second substrate 32 and the ground pattern 33G on the back surface of the third substrate 33 is made using a single bonding wire having a diameter of 25 μm, for example.

Accordingly, it is not necessary to increase, without reason, the number of metal wires to be added to the back surface of each substrate, and it is possible to prevent the heat from being fed back to the light emitting device via the wiring members added to the back surface of each substrate. Of course, a plurality of wiring members may be used to electrically connect the ground patterns of different substrates to each other, if the required specifications of the semiconductor package are satisfied. In this case, a further improvement of the electric characteristics can be expected.

Moreover, the first substrate 31 and the second substrate 32 are preferably formed of a material having a thermal conductivity lower than a thermal conductivity of the third substrate 33. In this case, it is possible to further prevent the heat, generated from the light emitting device 60 during operation thereof and transferred by the Peltier device 70, from being fed back to the light emitting device 60 via the first substrate 31 and the second substrate 32. In order to obtain this effect of further preventing the heat from being fed back to the light emitting device 60, the first substrate 31 and the second substrate 32 may be formed of alumina, and the third substrate 33 may be formed of aluminum nitride, for example.

When using the bonding wire as the wiring member 80, the electric characteristics are improved by increasing the diameter of the bonding wire, but the feedback of the heat is more likely to occur. Accordingly, when the improvement of the electric characteristics and the prevention of the feedback of the heat are taken into consideration, the diameter of the bonding wire is preferably approximately 25 μm.

<First Modification of First Embodiment>

A first modification of the first embodiment uses a header for the semiconductor package having a structure different from that of the first embodiment. In the first modification of the first embodiment, a description of the parts that are the same as those of the embodiment described above may be omitted.

Figure 7:
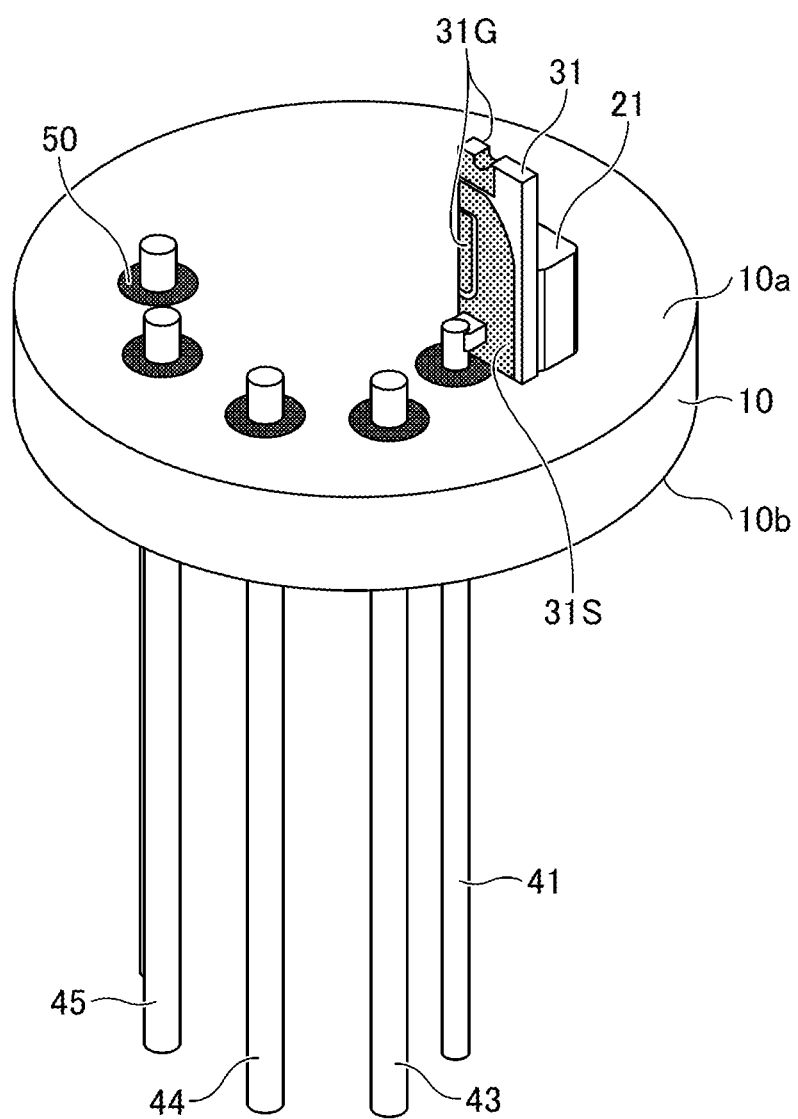
FIG. 7 is a perspective view illustrating an example of the header for the semiconductor package according to a first modification of the first embodiment.

FIG. 7 is a perspective view illustrating an example of the header for the semiconductor package according to the first modification of the first embodiment, and illustrates the header for the semiconductor package viewed from the front side of the first substrate. As illustrated in FIG. 7, a header 1A for the semiconductor package according to the first modification of the first embodiment differs from the header 1 for the semiconductor package (refer to FIG. 1 through FIG. 3, or the like) in that the second metal block 22, the second substrate 32, and the second lead 42 are omitted.

The header 1 for the semiconductor package according to the first embodiment is configured to cope with the differential type driving circuit, while the header 1A for the semiconductor package is configured to cope with a single-end type driving circuit. For this reason, only one system of driving signal input line, namely, the signal pattern 31S, is required, thereby making it unnecessary to provide the second metal block 22, the second substrate 32, and the second lead 42.

The header 1A for the semiconductor package may be provided with the third metal block 23, the third substrate 33, the light emitting device 60, the Peltier device 70, the cap 100, and the transparent member 110 to form the semiconductor package, similar to the header 1 for the semiconductor package. In this case, the signal pattern and the ground pattern of the third substrate 33 may be suitably designed according to the single-end type driving circuit.

Similar to header 1 for the semiconductor package, in the header 1A for the semiconductor package configured to cope with the single-end type driving circuit, at least a portion of the ground pattern 31G on the back surface of the first substrate 31 is exposed from the first metal block 21. For this reason, when the semiconductor package is manufactured using the header 1A for the semiconductor package, the ground pattern 31G on the back surface of the first substrate 31, exposed from the first metal block 21, and the ground pattern 33G on the back surface of the third substrate 33, exposed from the third metal block 23 on the side of the first substrate 31, can be electrically connected to each other via the one or more wiring members 80. As a result, this first modification can obtain effects that are the same the effects obtainable in the first embodiment.

[Simulation]

Next, results of the simulations of the electrical connection between the ground patterns on the back surfaces of the first substrate 31, the second substrate 32, and the third substrate 33 will be described in detail. Analyzing software, ANSYS Electromagnetics Suite 2019 R3, was used for the simulations. The wiring member 80 was assumed to be a gold bonding wire having a diameter of 25 μm. Although the simulation results are illustrated only with respect to the side of the first substrate 31, similar results are obtained with respect to the side of the second substrate 32 which is symmetrical to the left and right.

[Simulation 1]

In a simulation 1, the number of the wiring members 80 electrically connecting the ground patterns on the back surfaces of the first substrate 31 and the third substrate 33 to each other was set to two, and the simulation was performed for the characteristics that differ according to the positions along the height direction connecting the wiring member 80. In addition, as a comparative example, the simulation was also performed for a case where no wiring member 80 is connected.

Figure 8A:
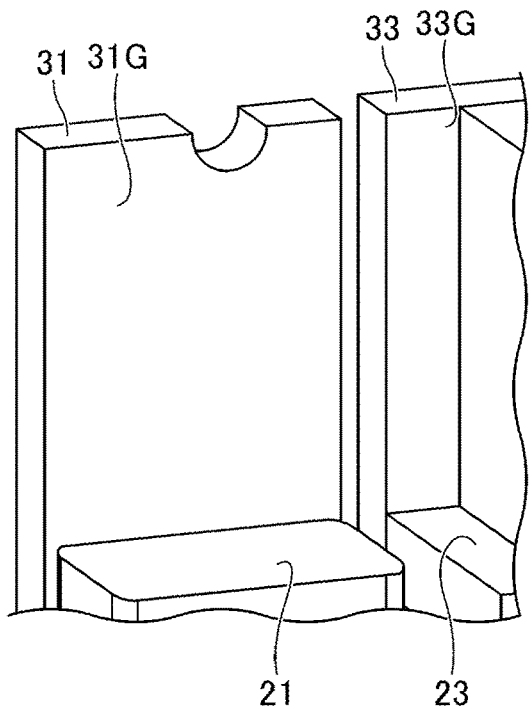
FIG. 8A, FIG. 8B, FIG. 8C, and FIG. 8D are diagrams (part 1) for explaining a simulation.
Figure 8B:
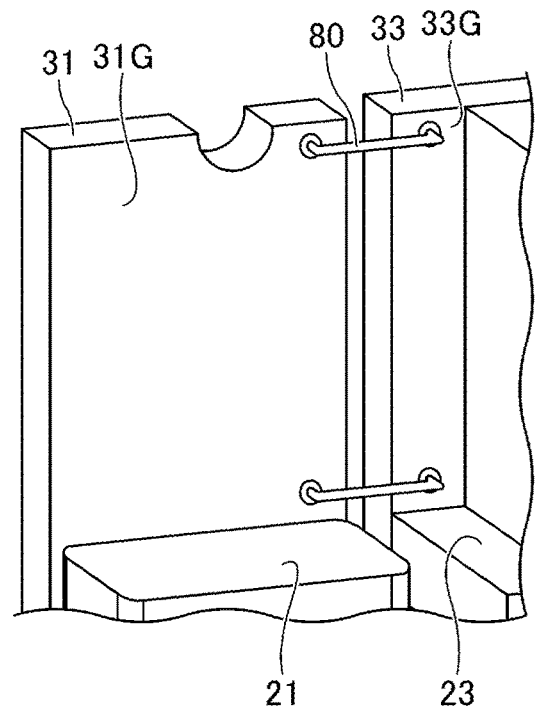
Figure 8C:
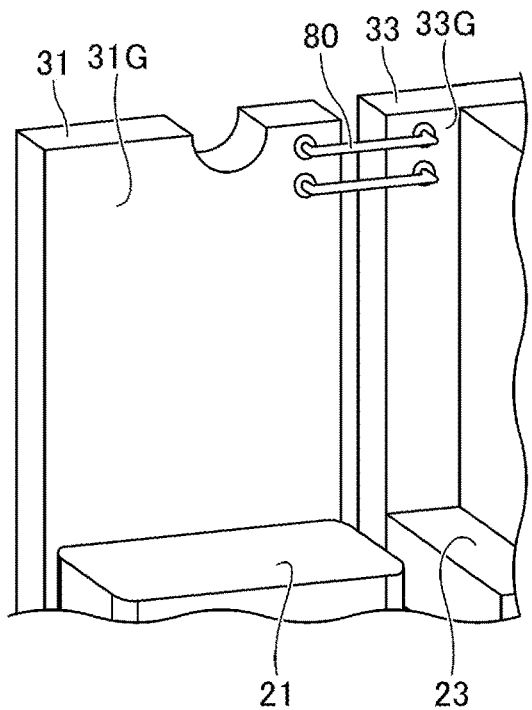
Figure 8D:
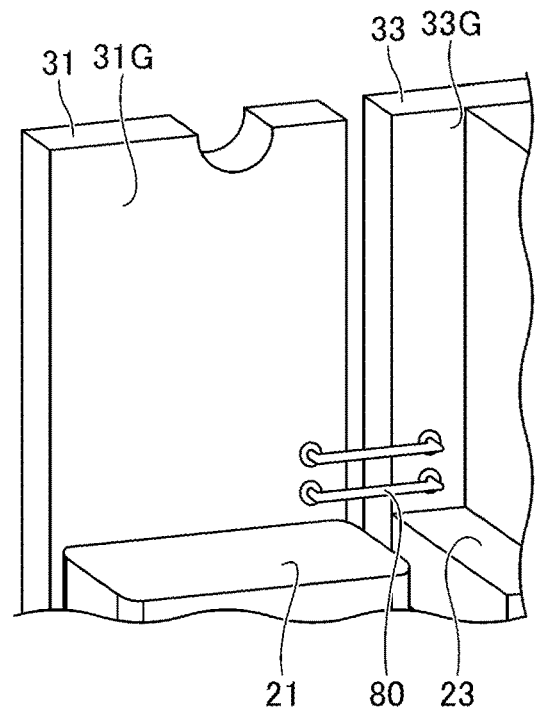

More particularly, a reflection loss (dB) and an insertion loss (dB) were obtained for the case (comparative example) where no wiring member 80 is connected as illustrated in FIG. 8A, a case where two wiring members 80, one connected to the upper side and the other connected to the lower side, are connected as illustrated in FIG. 8B, a case where two wiring members 80 are connected only to the upper side as illustrated in FIG. 8C, and a case where two wiring members 80 are connected only to the lower side as illustrated in FIG. 8D.

Figure 9:
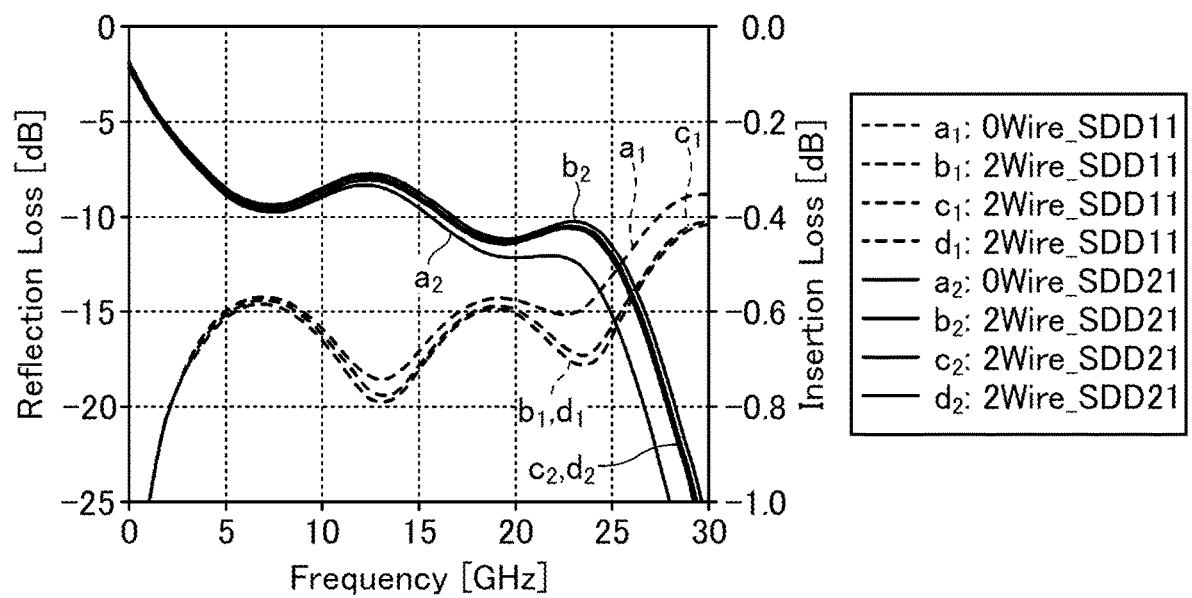
FIG. 9 is a diagram (part 1) for explaining simulation results.

The simulation results for these cases are illustrated in FIG. 9. In FIG. 9, a characteristic indicated by a dashed line represents a reflection loss (SDD11) in a differential mode, and a characteristic indicated by a solid line represents an insertion loss (SDD21) in the differential mode. In FIGS. 9, $a_1$ and $a_2$ are the characteristics for the case illustrated in FIG. 8A, $b_1$ and $b_2$ are the characteristics for the case illustrated in FIG. 8B, $c_1$ and $c_2$ are the characteristics for the case illustrated in FIG. 8C, and $d_1$ and $d_2$ are the characteristics for the case illustrated in FIG. 8D.

When electrically connecting the two wiring members 80 illustrated in FIG. 8B through FIG. 8D, it was confirmed from the characteristics $a_1$, $b_1$, $c_1$, and $d_1$ of FIG. 9 that the insertion loss (SDD11) improves as the frequency becomes higher, compared to the case where no wiring member 80 is connected as illustrated in FIG. 8A. In addition, when electrically connecting the two wiring members 80 illustrated in FIG. 8B through FIG. 8D, it was confirmed from the characteristics $a_2$, $b_2$, $c_2$, and $d_2$ of FIG. 9 that the insertion loss (SDD21) improves as the frequency becomes higher, compared to the case where no wiring member 80 is connected as illustrated in FIG. 8A.

However, in FIG. 9, because the characteristics $b_1$ through $d_1$ and the characteristics $b_2$ through $d_2$ overlap and appear as one characteristic, and there is no significant difference among these characteristics, it is important to electrically connect the wiring members 80, while the positions where the wiring members 80 are electrically connected are not as important.

Further, according to further studies conducted by the present inventors, it was confirmed that when the number of the wiring members 80 is one, an intermediate characteristic, between the characteristics $a_1$ and $b_1$ through $d_1$ and the characteristics $a_2$ and $b_2$ through $d_2$ illustrated in FIG. 9, are obtained. It was also confirmed that the effects described above can be obtained to a certain extent, even if only one wiring member 80 is used for the electrical connection.

[Simulation 2]

In a simulation 2, the influences for cases where the height of the first metal block 21 is varied, were simulated when the number of wiring members 80 is two and eight, respectively.

Figure 10A:
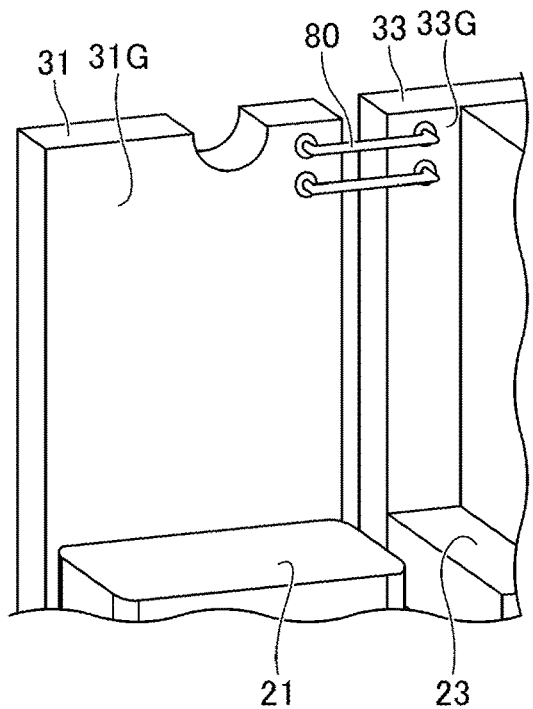
FIG. 10A, FIG. 10B, FIG. 10C, and FIG. 10D are diagrams (part 2) for explaining the simulation.
Figure 10B:
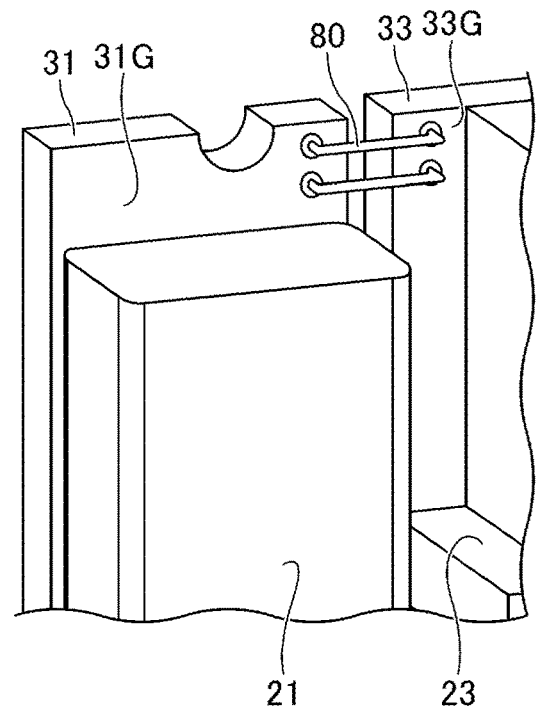
Figure 10C:
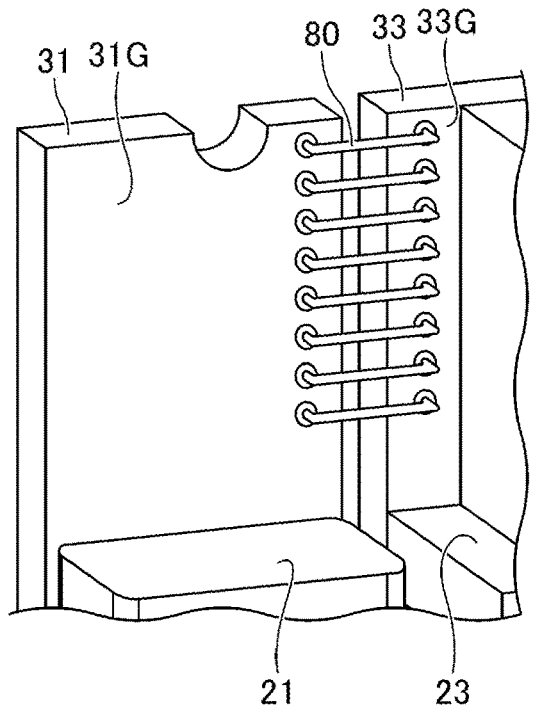
Figure 10D:
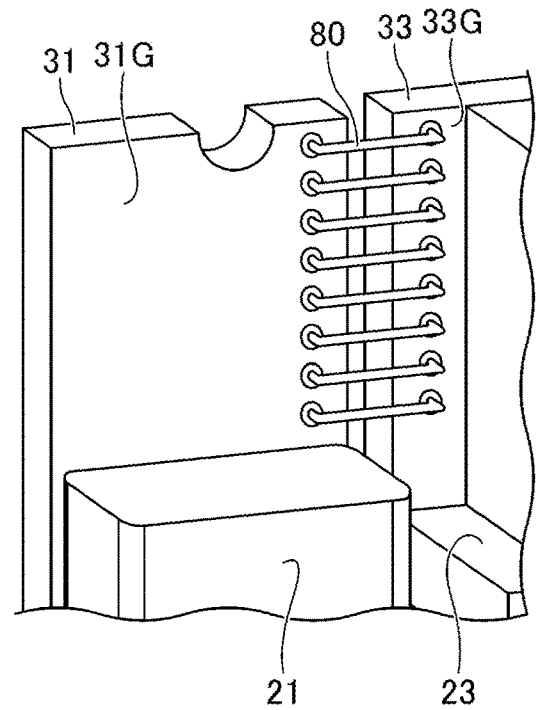

More particularly, the reflection loss (dB) and the insertion loss (dB) were obtained for a case where the height of the first metal block 21 is low and two wiring members 80 are connected only to the upper side as illustrated in FIG. 10A, a case where the height of the first metal block 21 is high and two wiring members 80 are connected only to the upper side as illustrated in FIG. 10B, a case where the height of the first metal block 21 is low and eight wiring members 80 are connected approximately over the entirety along a height direction as illustrated in FIG. 10C, and a case where the height of the when the first metal block 21 is high and eight wiring members 80 are connected approximately over the entirety along the height direction as illustrated in FIG. 10D.

Figure 11:
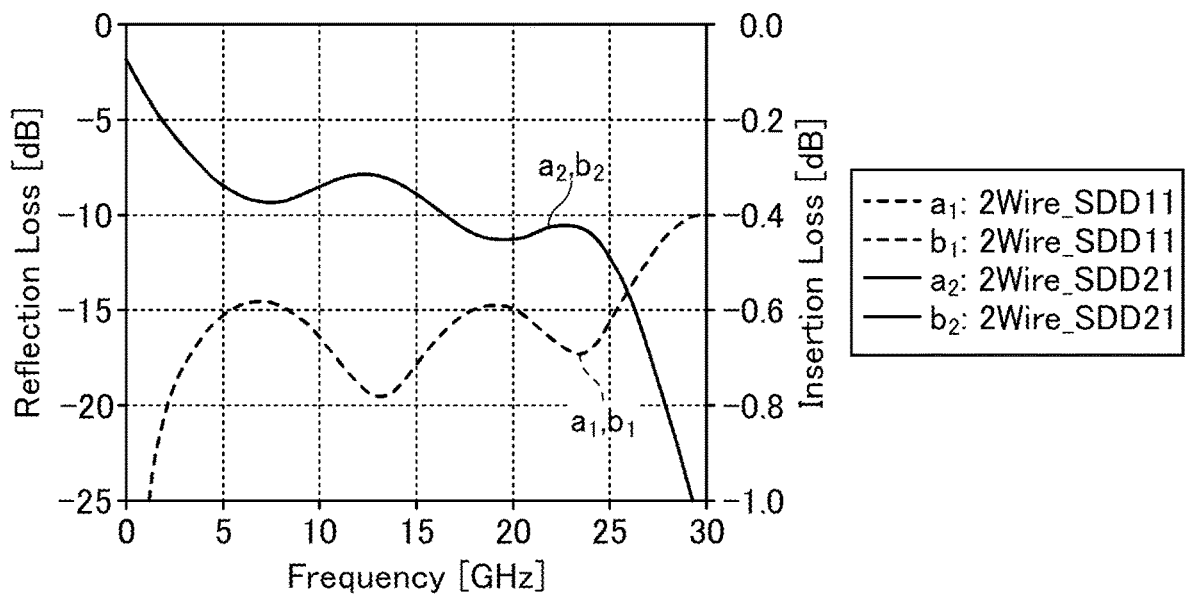
FIG. 11 is a diagram (part 2) for explaining the simulation results.
Figure 12:
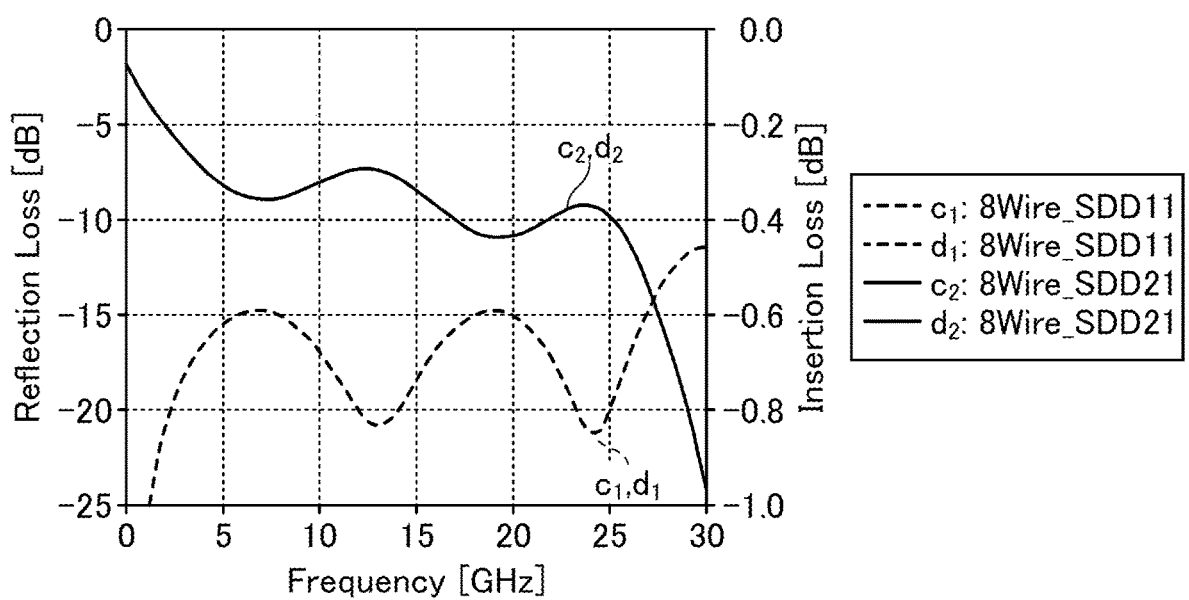
FIG. 12 is a diagram (part 3) for explaining the simulation results.

The simulation results for FIG. 10A and FIG. 10B are illustrated in FIG. 11, and the simulation results for FIG. 10C and FIG. 10D are illustrated in FIG. 12. In FIG. 11 and FIG. 12, a characteristic indicated by a dashed line represents the reflection loss (SDD11) in the differential mode, and a characteristic indicated by a solid line represents the insertion loss (SDD21) in the differential mode. In FIGS. 11, $a_1$ and $a_2$ are the characteristics for the case illustrated in FIG. 10A, and $b_1$ and $b_2$ are the characteristics for the case illustrated in FIG. 10B. In FIG. 12, $c_1$ and $c_2$ are the characteristics for the case illustrated in FIG. 10C, and $d_1$ and $d_2$ are the characteristics for the case illustrated in FIG. 10D.

According to FIG. 11 and FIG. 12, for the case where the two wiring members 80 are connected and for the case where the eight wiring members 80 are connected, the respective characteristics overlap each other, and the influences of the height of the first metal block 21 cannot be continued. Further, when FIG. 11 and FIG. 12 are compared, the reflection loss (SDD11) and the insertion loss (SDD21) are improved when the eight wiring members 80 are connected compared to when the two wiring members 80 are connected.

[Simulation 3-1]

In a simulation 3-1, the influences for cases where the number of wiring members 80 that are connected is varied, while the height of the first metal block 21 is set constant, were simulated.

Figure 13A:
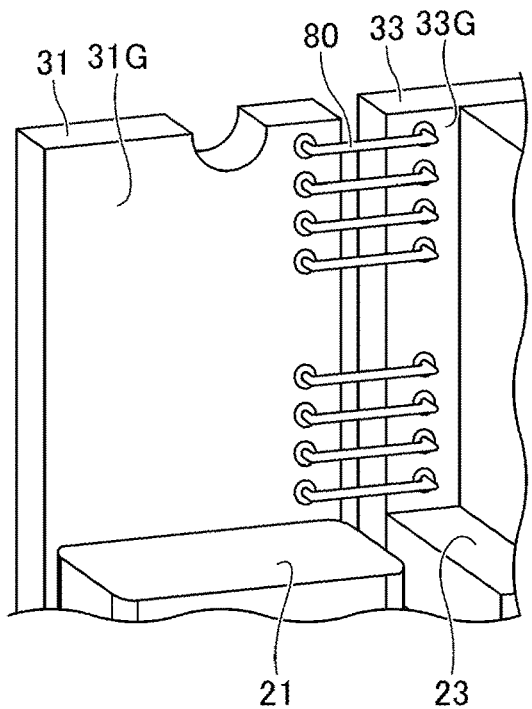
FIG. 13A, FIG. 13B, and FIG. 13C are diagrams (part 3) for explaining the simulation.
Figure 13B:
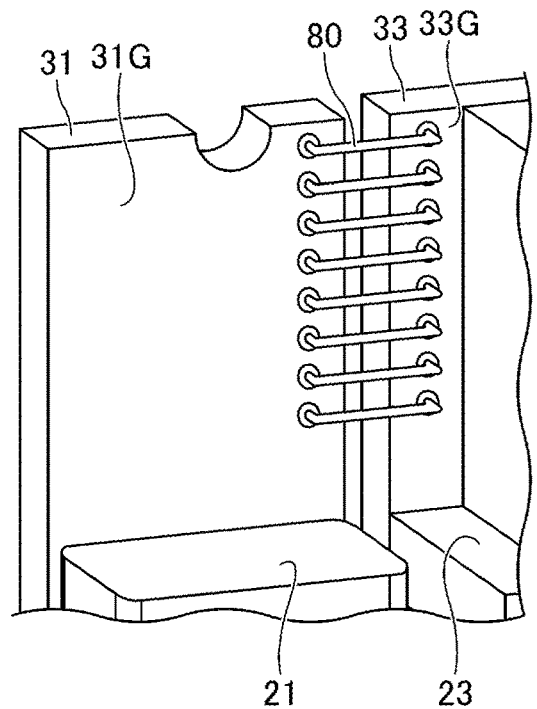
Figure 13C:
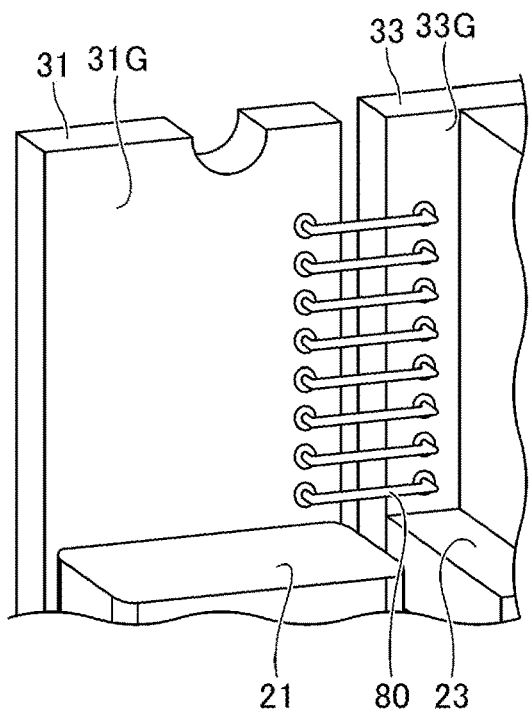

More particularly, a case where ten wiring members 80 are connected is taken as a reference, and the reflection loss (dB) and the insertion loss (dB) were obtained for a case where two central wiring members 80 are removed such that eight wiring members 80 are connected as illustrated in FIG. 13A, a case where the lower two wiring members 80 are removed such that eight wiring members 80 are connected as illustrated in FIG. 13B, and a case where upper two wiring members 80 are removed such that eight wiring members 80 are connected as illustrated in FIG. 13C.

Figure 14:
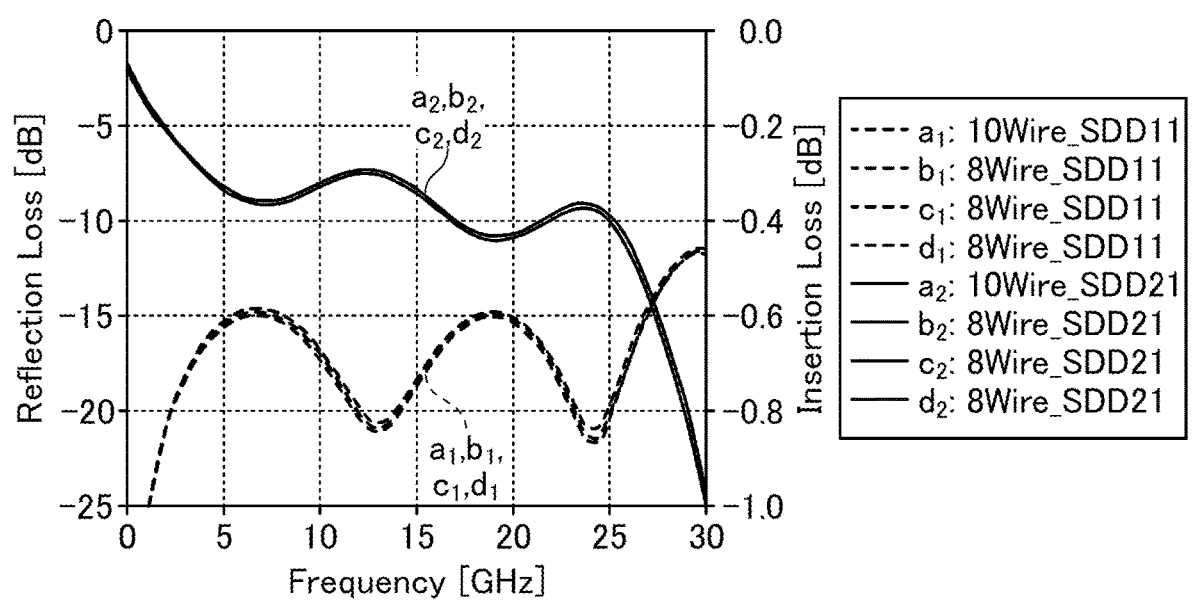
FIG. 14 is a diagram (part 4) for explaining the simulation results.

The simulation results for FIG. 13A through FIG. 13C, and for the case where ten wiring members 80 are connected, are illustrated in FIG. 14. In FIG. 14, the characteristics indicated by the dashed line represents the reflection loss (SDD11) in the differential mode, and the characteristic indicated by the solid line represents the insertion loss (SDD21) in the differential mode. In FIGS. 14, $a_1$ and $a_2$ are characteristics for the case where ten wiring members 80 are connected, $b_1$ and $b_2$ are characteristics for the case illustrated in FIG. 13A, $c_1$ and $c_2$ are characteristics for the case illustrated in FIG. 13B, and $d_1$ and $d_2$ are characteristics for the case illustrated in FIG. 13C.

According to FIG. 14, for the case where the ten wiring members 80 are connected and for the cases where the eight wiring members 80 are connected, the respective characteristics overlap each other, and the influences of reducing the number of wiring members 80 from ten to eight, nor significant differences observed due to the positions of the wiring members 80 that are removed, were confirmed.

[Simulation 3-2]

In a simulation 3-2, the influences for cases where the number of wiring members 80 that are connected is varied, while the height of the first metal block 21 is set constant, were simulated.

Figure 15A:
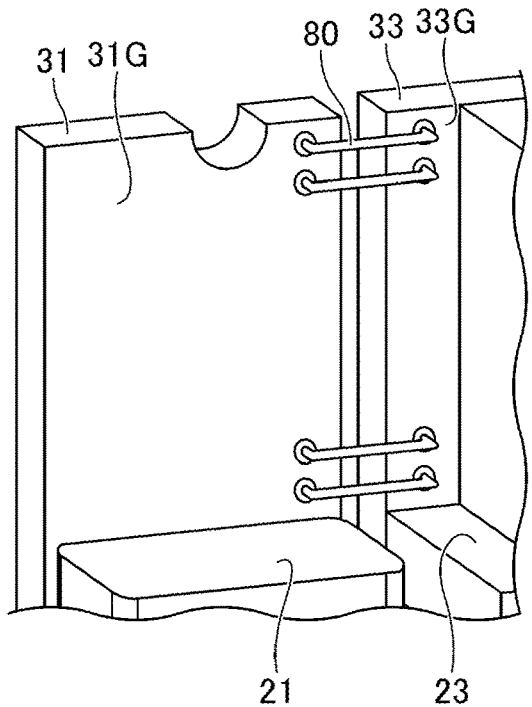
FIG. 15A, FIG. 15B, and FIG. 15C are diagrams (part 4) for explaining the simulation.
Figure 15B:
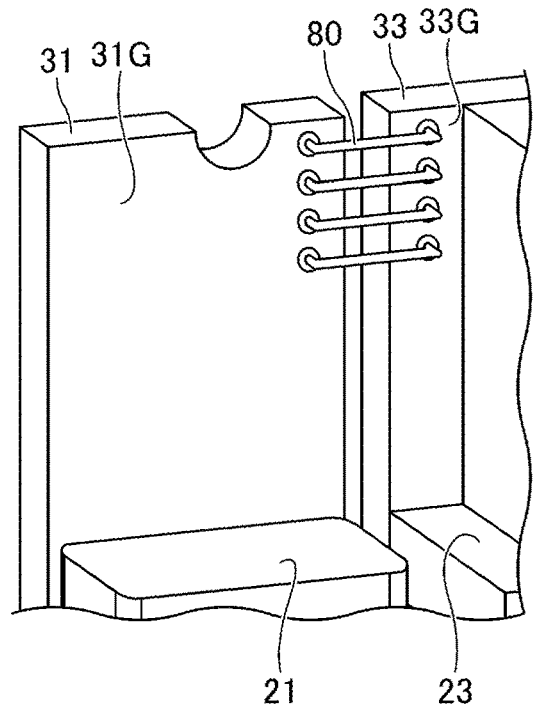
Figure 15C:
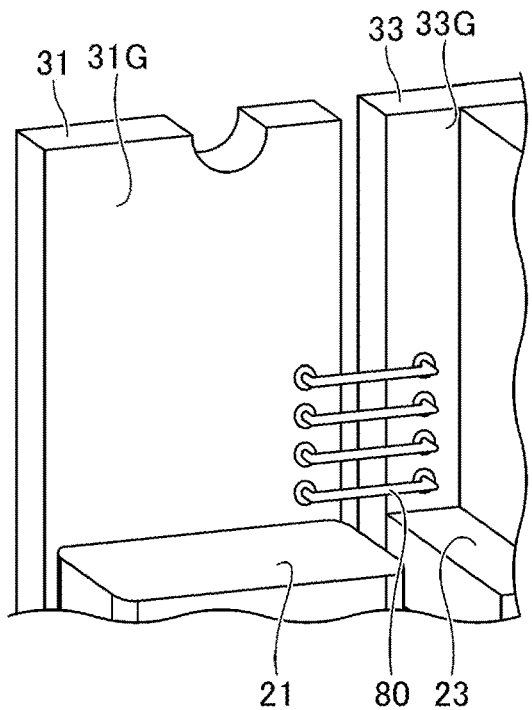

More particularly, the case where ten wiring members 80 are connected is taken as the reference, and the reflection loss (dB) and the insertion loss (dB) were obtained for a case where six central wiring members 80 are removed such that four wiring members 80 are connected as illustrated in FIG. 15A, a case where the lower six wiring members 80 are removed such that four wiring members 80 are connected as illustrated in FIG. 15B, and a case where upper six wiring members 80 are removed such that four wiring members 80 are connected as illustrated in FIG. 15C.

Figure 16:
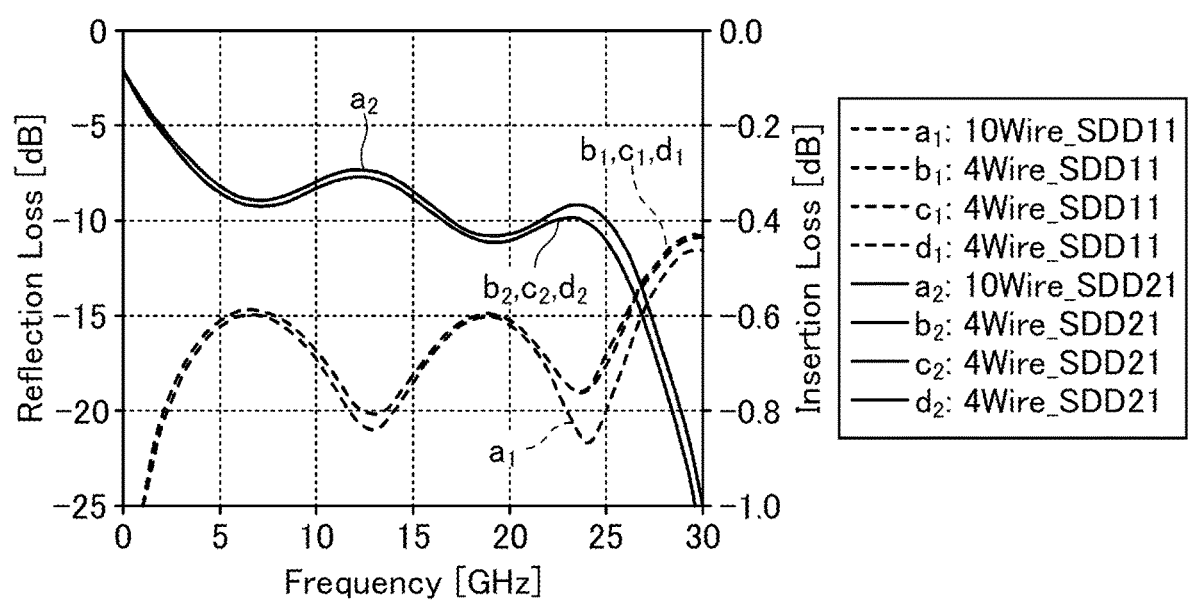
FIG. 16 is a diagram (part 5) for explaining the simulation results.

The simulation results for FIG. 15A through FIG. 15C, and for the case where the ten wiring members 80 are connected, are illustrated in FIG. 16. In FIG. 16, the characteristics indicated by the dashed line represents the reflection loss (SDD11) in the differential mode, and the characteristic indicated by the solid line represents the insertion loss (SDD21) in the differential mode. In FIGS. 16, $a_1$ and $a_2$ are characteristics for the case where the ten wiring members 80 are connected, $b_1$ and $b_2$ are characteristics for the case illustrated in FIG. 15A, $c_1$ and $c_2$ are characteristics for the case illustrated in FIG. 15B, and $d_1$ and $d_2$ are characteristics for the case illustrated in FIG. 15C.

According to FIG. 16, the tendency of the characteristics deteriorating with increasing frequency was confirmed for the cases where the number of wiring members that are connected is reduced from ten to eight. However, no significant differences due to the positions of the wiring members 80 that are removed were confirmed.

[Simulation 3-3]

In a simulation 3-3, the influences for cases where the number of wiring members 80 that are connected is varied, while the height of the first metal block 21 is set constant, were simulated.

Figure 17A:
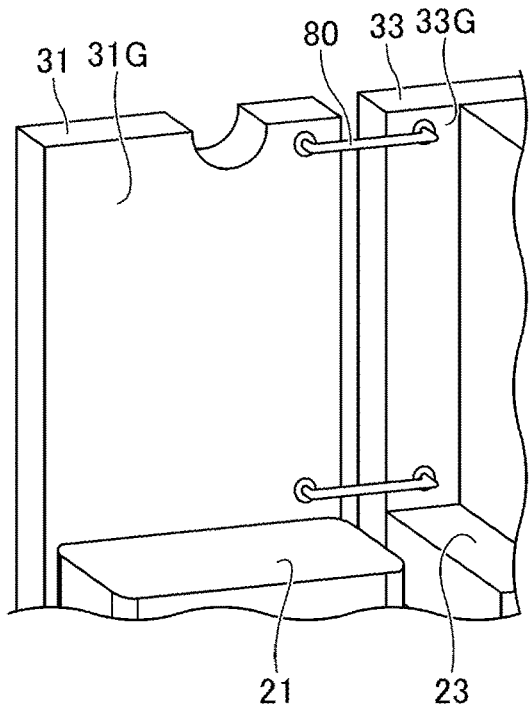
FIG. 17A, FIG. 17B, and FIG. 17C are diagrams (part 5) for explaining the simulation.
Figure 17B:
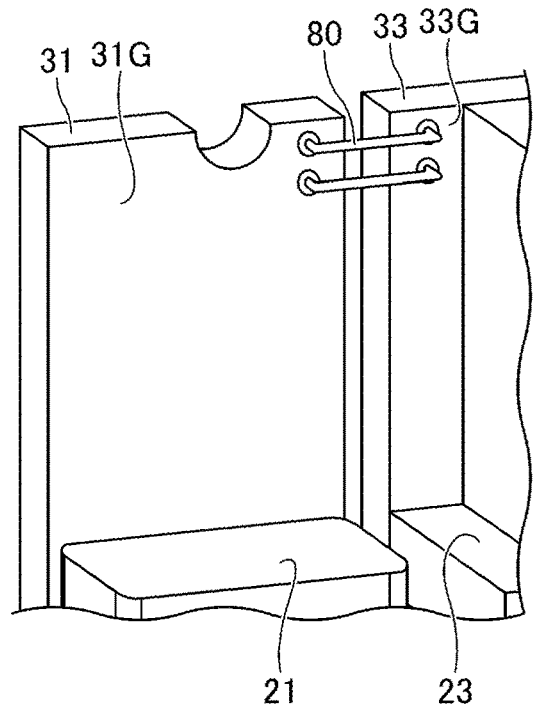
Figure 17C:
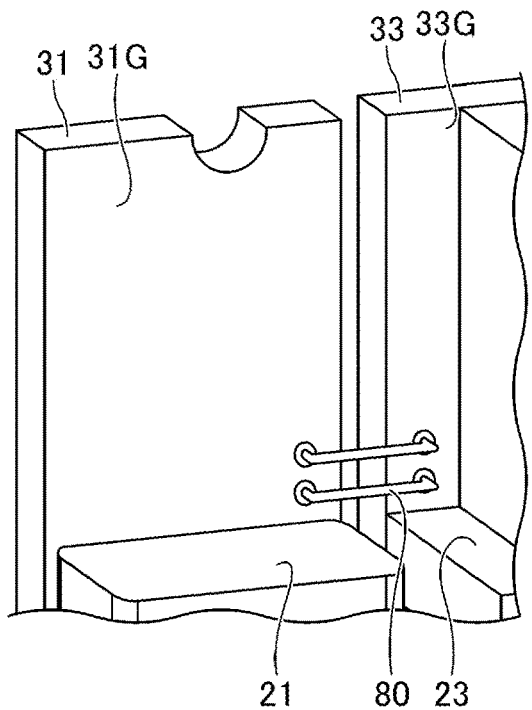

More particularly, the case where ten wiring members 80 are connected is taken as the reference, and the reflection loss (dB) and the insertion loss (dB) were obtained for a case where eight central wiring members 80 are removed such that two wiring members 80 are connected as illustrated in FIG. 17A, a case where the lower eight wiring members 80 are removed such that two wiring members 80 are connected as illustrated in FIG. 17B, and a case where upper eight wiring members 80 are removed such that two wiring members 80 are connected as illustrated in FIG. 17C.

Figure 18:
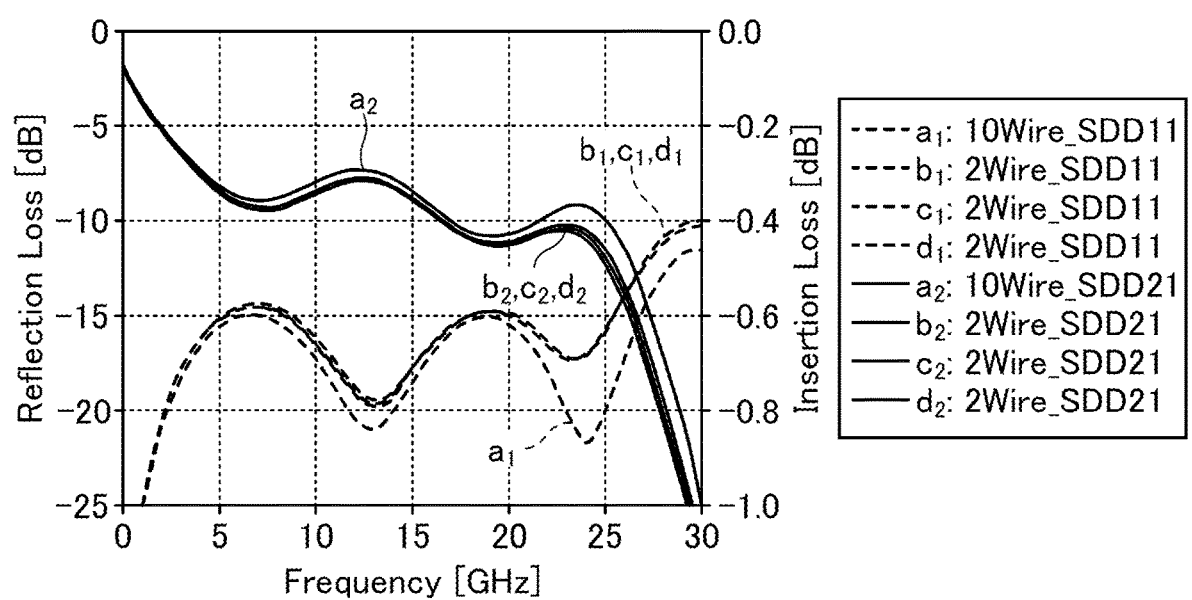
FIG. 18 is a diagram (part 6) for explaining the simulation results.

The simulation results for FIG. 17A through FIG. 17C, and for the case where the ten wiring members 80 are connected, are illustrated in FIG. 18. In FIG. 18, the characteristics indicated by the dashed line represents the reflection loss (SDD11) in the differential mode, and the characteristic indicated by the solid line represents the insertion loss (SDD21) in the differential mode. In FIG. 18, $a_1$ and $a_2$ are characteristics for the case where the ten wiring members 80 are connected, $b_1$ and $b_2$ are characteristics for the case illustrated in FIG. 17A, $c_1$ and $c_2$ are characteristics for the case illustrated in FIG. 17B, and $d_1$ and $d_2$ are characteristics for the case illustrated in FIG. 17C.

According to FIG. 18, the influences of reducing the number of wiring members 80 from ten to two are greater than the influences of reducing the number of wiring members 80 from ten to four or from ten to eight. However, no significant differences due to the positions of the wiring members 80 that are removed were confirmed.

The results of the simulations 1 through 3-3 can be summarized as follows. When the ground patterns on the back surfaces of the first substrate 31, the second substrate 32, and the third substrate 33 are electrically connected to each other, the effects described above can be obtained to a certain extent, even if only one wiring member 80 is used for the electrical connection. However, when the reflection loss and the insertion loss are taken into consideration, two or more wiring members 80 are used for the electrical connection. In addition, although the reflection loss and the insertion loss are further improved when three or more wiring members 80 are used for the electrical connection, however, no further improvement can be expected when more than eight wiring members 80 are used for the electrical connection. Further, no significant differences are observed regardless of the heights of the first metal block 21 and the second metal block 22, or the connecting positions of the wiring member 80 along the height direction.

In other words, when the improvement of the electric characteristics and the feedback of the heat are taken into consideration, the number of wiring members 80 connecting the first substrate 31 and the third substrate 33, and the second substrate 32 and the third substrate 33, at the back surfaces thereof, are preferably selected in a range of one or more and eight or less, within a range that satisfies the required specifications of the semiconductor package.

Accordingly to each of the embodiments described above, it is possible to further improve the electric characteristics.

Although the embodiments and modifications are numbered with, for example, "first," or "second," the ordinal numbers do not imply priorities of the embodiments and modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A header for a semiconductor package, comprising:
    an eyelet having an upper surface, and a lower surface on an opposite side from the upper surface;
    a first metal block having a first side surface, and configured to protrude from the upper surface of the eyelet;
    a first lead sealed in a first through hole which penetrates the eyelet from the upper surface to the lower surface of the eyelet; and
    a first substrate having a front surface formed with a first signal pattern electrically connected to the first lead, and a back surface on an opposite side from the front surface thereof, wherein
    the back surface of the first substrate is fixed to the first side surface of the first metal block,
    a first portion of the back surface of the first substrate is exposed from the first metal block at a position above an upper surface of the first metal block, and
    the first portion of the first substrate is formed with a ground pattern.

2. The header for the semiconductor package as claimed in claim 1, wherein a height of the upper surface of the first metal block with reference to the upper surface of the eyelet is lower than a height of an upper surface of the first substrate with reference to the upper surface of the eyelet.

3. The header for the semiconductor package as claimed in claim 2, wherein the height of the upper surface of the first metal block with reference to the upper surface of the eyelet is ½ the height of the upper surface of the first substrate or greater with reference to the upper surface of the eyelet.

4. A header for the semiconductor package comprising:
an eyelet having an upper surface, and a lower surface on an opposite side from the upper surface;
a first metal block having a first side surface, and configured to protrude from the upper surface of the eyelet;
a first lead sealed in a first through hole which penetrates the eyelet from the upper surface to the lower surface of the eyelet;
a first substrate having a front surface formed with a first signal pattern electrically connected to the first lead, and a back surface on an opposite side from the front surface thereof,
a second metal block having a second side surface facing the same side as the first side surface, and protruding from the upper surface of the eyelet;
a second lead sealed in a second through hole which penetrates the eyelet from the upper surface to the lower surface of the eyelet; and
a second substrate having a front surface formed with a second signal pattern electrically connected to the second lead, and a back surface on an opposite side from the front surface thereof, wherein
the back surface of the first substrate is fixed to the first side surface of the first metal block,
a first portion of the back surface of the first substrate is exposed from the first metal block,
the first portion of the first substrate is formed with a ground pattern,
the back surface of the second substrate is fixed to the second side surface of the second metal block,
the first metal block and the second metal block are arranged at positions separated from each other,
a second portion of the back surface of the second substrate is exposed from the second metal block, and
the second portion of the second substrate is formed with a ground pattern.

5. The header for semiconductor package as claimed in claim 4, wherein a height of an upper surface of the second metal block with reference to the upper surface of the eyelet is lower than a height of an upper surface of the second substrate with reference to the upper surface of the eyelet.

6. The header for semiconductor package as claimed in claim 5, wherein the height of the upper surface of the second metal block with reference to the upper surface of the eyelet is ½ the height of the upper surface of the second substrate or greater with reference to the upper surface of the eyelet.

7. The header for the semiconductor package as claimed in claim 4, wherein the first side surface and the second side surface are coplanar.

8. A semiconductor package comprising:
the header for the semiconductor package according to claim 4;
a Peltier device arranged on the upper surface of the eyelet;
a third metal block having a third side surface facing the same side as the first side surface and the second side surface, and arranged on the Peltier device; and
a third substrate having a front surface mounted with a light emitting device, and a back surface on an opposite side from the front surface thereof, wherein
the back surface of the third substrate is fixed to the third side surface of the third metal block,
a third portion of the back surface of the third substrate is exposed from the first substrate side of the third metal block,
a fourth portion of the back surface of the third substrate is exposed from the second substrate side of the third metal block,
the third portion and the fourth portion of the third substrate are formed with a ground pattern,
the first metal block and the third metal block are arranged at positions separated from each other,
the second metal block and the third metal block are arranged at positions separated from each other,
the ground pattern formed on the first portion of the first metal block, and the ground pattern formed on the third portion of the third metal block are electrically connected via a wiring member, and
the ground pattern formed on the second portion of the second metal block, and the ground pattern formed on the fourth portion of the third metal block are electrically connected via a wiring member.

9. The semiconductor package as claimed in claim 8, wherein
the ground pattern formed on the first portion of the first metal block, and the ground pattern formed on the third portion of the third metal block are electrically connected via a plurality of wiring members, and
the ground pattern formed on the second portion of the second metal block, and the ground pattern formed on the fourth portion of the third metal block are electrically connected via a plurality of wiring members.

10. The semiconductor package as claimed in claim 8, wherein the first substrate and the second substrate are formed of a material having a thermal conductivity lower than a thermal conductivity of the third substrate.

11. A semiconductor package comprising:
a header for the semiconductor package comprising:
an eyelet having an upper surface, and a lower surface on an opposite side from the upper surface;
a first metal block having a first side surface, and configured to protrude from the upper surface of the eyelet;
a first lead sealed in a first through hole which penetrates the eyelet from the upper surface to the lower surface of the eyelet; and
a first substrate having a front surface formed with a first signal pattern electrically connected to the first lead, and a back surface on an opposite side from the front surface thereof, wherein
the back surface of the first substrate is fixed to the first side surface of the first metal block,
a first portion of the back surface of the first substrate is exposed from the first metal block, and
the first portion of the first substrate is formed with a ground pattern;
a Peltier device arranged on the upper surface of the eyelet;
a third metal block having a third side surface facing the same side as the first side surface, and arranged on the Peltier device; and a third substrate having a front surface mounted with a light emitting device, and a back surface on an opposite side from the front surface thereof, wherein the back surface of the third substrate is fixed to the third side surface of the third metal block, a third portion of the back surface of the third substrate is exposed from the third metal block, the third portion of the third substrate is formed with a ground pattern, the first metal block and the third metal block are arranged at positions separated from each other, and the ground pattern formed on the first portion of the first metal block, and the ground pattern formed on the third portion of the third metal block are electrically connected via a wiring member.

12. The semiconductor package as claimed in claim 10, wherein the first substrate and the second substrate are made of alumina, and the third substrate is made of aluminum nitride.

* * * * *